United States Patent [19]

Kurby

[11] Patent Number: 4,481,489
[45] Date of Patent: Nov. 6, 1984

[54] BINARY SIGNAL MODULATING CIRCUITRY FOR FREQUENCY MODULATED TRANSMITTERS

[75] Inventor: Christopher N. Kurby, Elmhurst, Ill.
[73] Assignee: Motorola Inc., Schaumburg, Ill.
[21] Appl. No.: 280,156
[22] Filed: Jul. 2, 1981
[51] Int. Cl.[3] .................... H03C 3/09; H04L 27/12
[52] U.S. Cl. ...................................... 332/19; 331/23; 332/30 V; 375/65; 375/120; 455/102; 455/113; 455/126
[58] Field of Search ................ 332/19, 30 V; 375/45, 375/62, 65, 120; 331/23; 455/102, 113, 126

[56] References Cited

U.S. PATENT DOCUMENTS

| | | | |
|---|---|---|---|
| 3,743,775 | 7/1973 | Hutchinson et al. | 178/88 |
| 3,761,625 | 9/1973 | Bruene | 178/66 A |
| 3,993,868 | 11/1976 | Balcewicz | 178/66 R |
| 4,003,001 | 1/1977 | Jones, Jr. | 332/1 |
| 4,052,672 | 10/1977 | Enderby | 325/147 |
| 4,068,198 | 1/1978 | Otto | 332/19 |
| 4,074,209 | 2/1978 | Lysobey | 332/19 |
| 4,272,730 | 6/1981 | Digiovanni | 331/16 |
| 4,303,893 | 12/1981 | Goldberg | 331/1 A |
| 4,308,508 | 12/1981 | Sommer et al. | 332/19 X |

OTHER PUBLICATIONS

UH Syntor Synthesizer, Manual #68P81043E45, Motorola, Inc., 1980.
Parallel Input PLL Frequency Synthesizer, MC145152, Motorola, Inc., 1980.
Binary Counter, MC10178, Motorola, Inc., 1974.
4-Bit Data Bus Input PLL Frequency Synthesizer, MC145146, Motorola, Inc., 1980.
Dual 3-Input 3-Output NOR Gate, MC10211, Motorola, Inc., 1974.
Semiconductor Update, vol. 5, No. 11, Mar./Apr., Motorola, Inc., 1981, p. 5.

Primary Examiner—Siegfried H. Grimm
Attorney, Agent, or Firm—Rolland R. Hackbart; Edward M. Roney; James W. Gillman

[57] ABSTRACT

A frequency modulator for radio frequency (RF) signals is described that symmetrically modulates the RF signal with either binary signals or voice signals without distorting the amplitude of the binary signal near bit edges. The inventive frequency modulator includes a reference signal generator, a phase comparator for comparing the reference signal and a feedback signal to provide an error signal, a filter for filtering the error signal, a voltage-controlled oscillator (VCO) responsive to the filtered error signal for generating an output signal, a divider for dividing the VCO output signal by a predetermined number to provide the feedback signal, circuitry coupled to the VCO for modulating the VCO output signal with the binary signal, and circuitry coupled to the divider for varying the predetermined number of the divider between a first predetermined number and a second predetermined number in response to the binary signal. Since both the VCO and the divider are modulated by the binary signals, the filtered error signal applied to the VCO remains essentially constant, while the frequency of the VCO is symmetrically varied.

10 Claims, 4 Drawing Figures

BINARY SIGNAL MODULATING CIRCUITRY FOR FREQUENCY MODULATED TRANSMITTERS

BACKGROUND OF THE INVENTION

The present invention relates generally to frequency modulated (FM) signal transmission, and more particularly to modulating circuitry for FM transmitters.

In communication systems, it is becoming increasingly necessary to communicate binary signals between stations. Such binary signals are typically encoded in FM communication systems by symmetrically deviating the frequency of the transmitted FM signal. For example, the frequency of the FM signal may be increased by a predetermined amount in response to a first binary state and decreased by the same predetermined amount in response to a second binary state. However, if the transmitted binary signal does not have an equal number of each of the binary states, it is possible that the frequency of the transmitted FM signal will be offset by a small amount. Because of the frequency offset, the frequency of the FM signal will be deviated unsymmetrically by the binary signal. The frequency stability of the transmitter appears to be degraded by such frequency offsets. Both degradation in the frequency stability and maximum frequency deviation are strictly regulated by the Federal Communications Commission. Furthermore, since the receiving station is precisely tuned to the predetermined frequency of the RF signal, reception of the modulated RF signal is also degraded due to the frequency offset introduced by the binary signal. The introduction of such frequency offsets is further aggravated as the bit rate of the binary bit stream is decreased.

One solution to the frequency offset problem is to directly modulate the transmitter oscillator which may be thereafter multiplied to generate the RF signal. However, a modulatable oscillator not only costs more than, but also has a lower frequency stability than non-modulatable oscillators.

In the case of frequency synthesized transmitters, symmetrical deviation of the FM signal can be obtained by both modulating the reference oscillator and the voltage-controlled oscillator in the frequency synthesizer. However, such frequency synthesized transmitters must likewise utilize expensive modulatable oscillators in order to achieve high frequency stability.

Another approach utilizing a synthesizer modulates the voltage-controlled oscillator with voice signals and the loop divider with binary signals. However, such an approach requires a wider loop bandwidth when the loop divider is modulated with a binary signal. As the loop bandwidth is increased to accomodate binary signals, noise and distortion of the modulated signal are more difficult to simultaneously minimize.

According yet to another approach, two frequency synthesizers can be utilized, one for binary signal modulation and one for voice signal modulation. In such transmitters, the voice signal modulates the voltage-control oscillator of its synthesizer and the binary signal modulates the divider of its synthesizer. The modulated signals from the two frequency synthesizers may then be mixed together to provide a composite RF signal. The two synthesizer approach is not only costly in that two synthesizers are required, but also is subject to the same noise and distortion problem encountered in the preceding approach.

Thus, none of the foregoing prior art approaches can provide an inexpensive frequency modulator that symmetrically deviates an RF signal with either voice or binary signals without introducing undesirable frequency stability, noise or distortion degradation.

SUMMARY OF THE INVENTION

Accordingly, it an object of the present invention to provide an improved frequency modulator that symetrically modulates an FM signal with either binary signals or voice signals.

It is another object of the present invention to provide an improved frequency modulator that symmetrically modulates a high stability FM signal with either binary signals or voice signals.

It is yet another object of the present invention to provide an improved frequency modulator that symetrically modulates an externally phase and frequency synchronized FM signal with either binary signals or voice signals.

According to an embodiment of the present invention, a frequency modulator includes a reference signal generator, a phase comparator for comparing the reference signal and a feedback signal to provide an error signal, a filter for filtering the error signal, a voltage-controlled oscillator (VCO) responsive to the filtered error signal for generating an output signal, a divider for dividing the VCO output signal by a predetermined number to provide the feedback signal, circuitry coupled to the VCO for modulating the VCO output signal with the binary signal, and circuitry coupled to the divider for varying the predetermined number of the divider between a first predetermined number and a second predetermined number in response to the binary signal. Since both the VCO and the divider are modulated by the binary signals, the filtered error signal applied to the VCO remains essentially constant. As a result, the frequency of the VCO is symetrically varied in response to the binary signals.

BRIEF DESCRIPTION OF THE DRAWINGS

FIG. 4 is a block diagram of the frequency synthesizer in FIGS. 1 and 2.

DETAILED DESCRIPTION OF THE PREFERRED EMBODIMENTS

Figure 1:
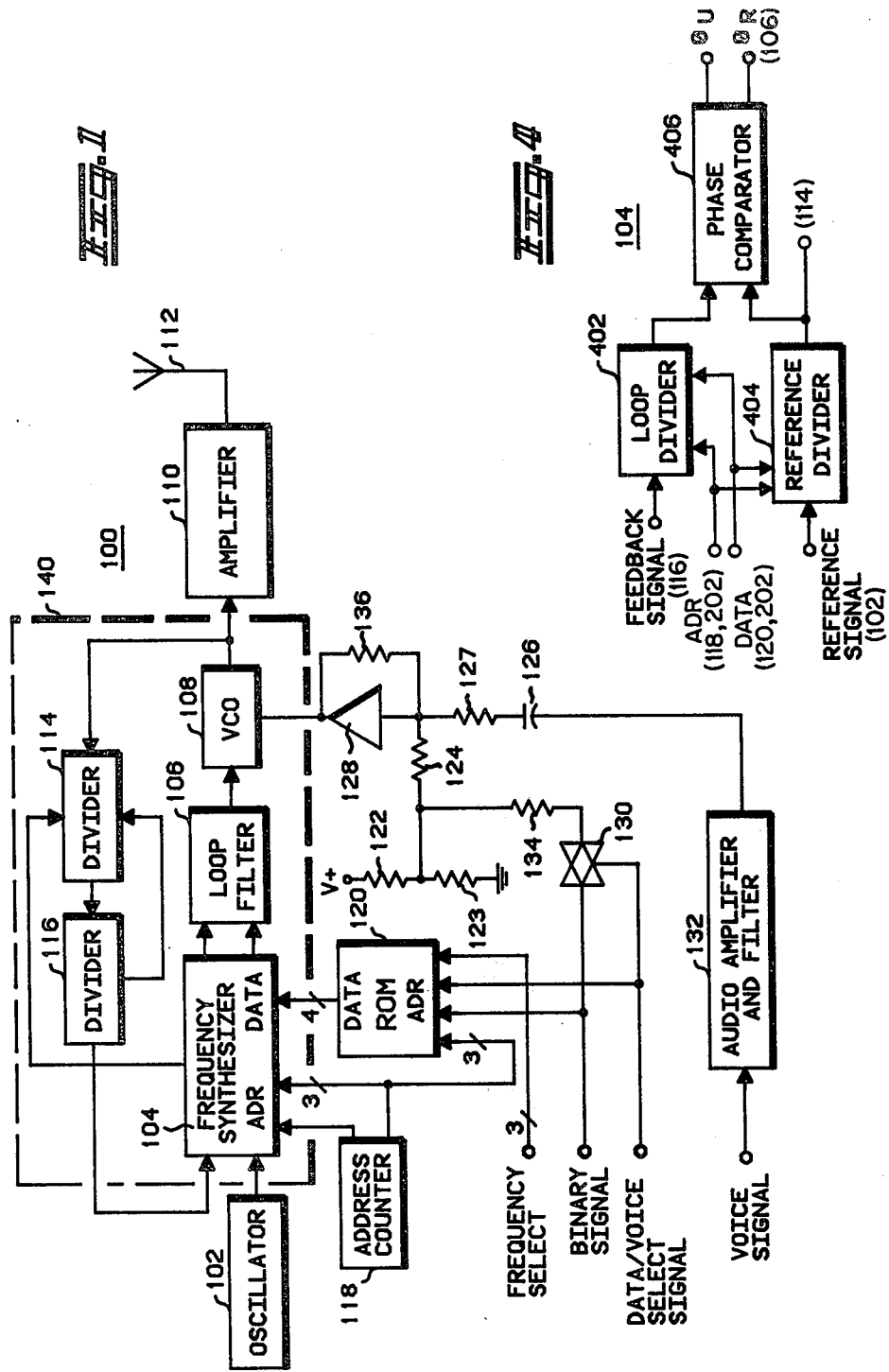
FIG. 1 is a block diagram of an FM transmitter embodying the frequency modulator of the present invention.
Figure 2:
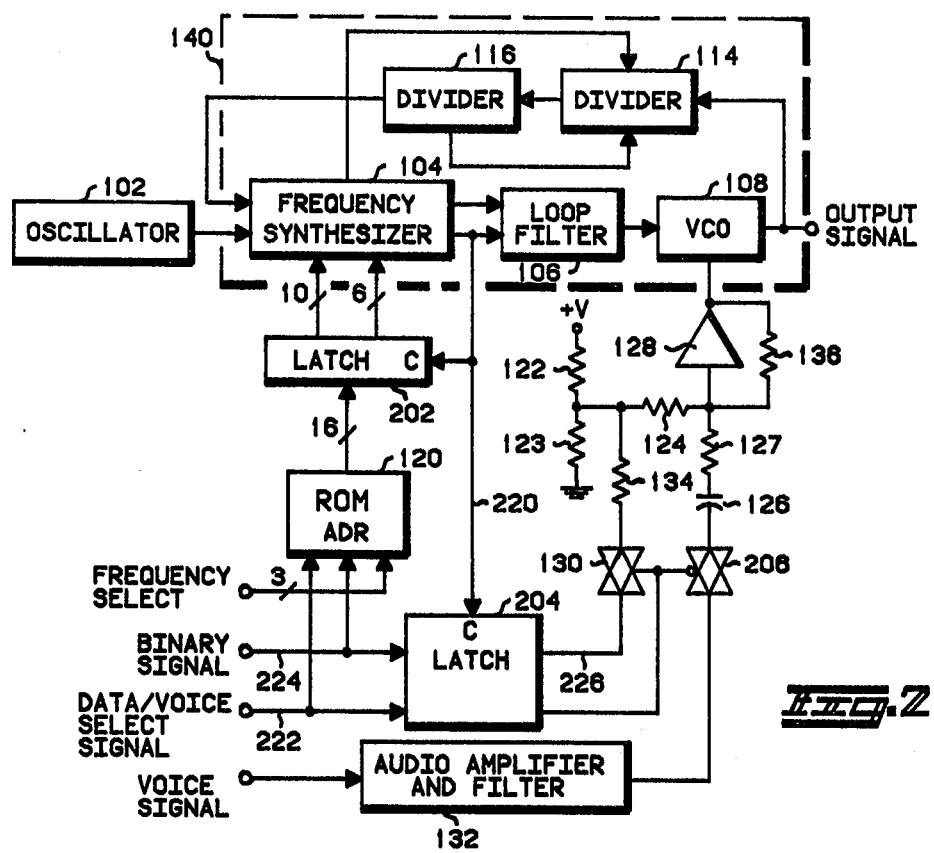
FIG. 2 is a block diagram of a second embodiment of the frequency modulator of the present invention.

In FIG. 1, there is illustrated a block diagram of an FM transmitter 100 embodying the present invention. The frequency of the FM signal transmitted by antenna 112 is determined by frequency select signals, three of which are illustrated in FIGS. 1 and 2. The frequency select signals are coupled to the address inputs of read-only memory (ROM) 120 for reading out numbers from ROM 120 which are loaded into a reference divider and a loop divider (404 and 402 in FIG. 4) in frequency synthesizer 104. A phase-locked loop 140 comprised of blocks 104, 106, 108, 114 and 116 develops an output signal which may be amplified by amplifier 110 and thereafter directly applied to antenna 112 to provide the RF signal. Phase-locked loop 140 may be operated at different frequencys corresponding to different RF channels by changing the integer number N which is the composite divider number of dividers 114 and 116 and the loop divider (402 in FIG. 4) in frequency synthesizer 104. A reference oscillator 102 is applied to the phase-locked loop 140 and has a frequency selected to provide both the desired frequency increment between the RF channels and desired frequency deviation for binary signals.

Frequency synthesizer 104 may be a conventional circuit, such as a Motorola type MC145146 frequency synthesizer (incorporated herein by reference thereto), which includes a loop divider 402, reference divider 404 and a phase comparator 406, as illustrated in FIG. 4. The internal dividers 402 and 404 of the Motorola type MC145146 frequency synthesizer 104 are sequentially loaded four bits at a time by means of address counter 118. The exact interconnections between frequency synthesizer 104 and blocks 102, 106, 114, 116, 118 and 120 can be readily determined from the published specifications for the Motorola type MC145146 frequency synthesizer. The error signal from phase comparator 406 is frequency synthesizer 104 is coupled to loop filter 106, which may be a conventional operational amplifier arranged as a low-pass filter. The filtered error signal from loop filter 106 is applied to the control input of a conventional voltage-controlled oscillator (VCO) 108. As the magnitude of the filtered error voltage from loop filter 106 varies, the operating frequency of VCO 108 likewise varies. VCO 108 also has a modulation input coupled to summing amplifier 128. The output signal from VCO 108 is coupled to a dual modulus prescaler comprised of dividers 114 and 116. Dividers 114 and 116, which may be Motorola type MC12011 and MC10178 dividers (incorporated herein by reference thereto), respectively, are responsive to a signal from frequency synthesizer 104 for dividing the VCO output signal by a selected integer P or P+1. The output from divider 116 is applied to loop divider 402 in frequency synthesizer 104. The output from loop divider 402 in frequency synthesizer 104 is applied to phase comparator 406 therein together with the output from reference divider 404, which is coupled to the reference signal from reference oscillator 102. The integer number loaded into reference divider 404 determines the frequency deviation for binary signals and the frequency increment between RF channels. The overall divider integer number N depends on the integer number P for dividers 114 and 116 and the integer number loaded into the loop divider 402.

According to an important feature of the present invention, both VCO 108 and the divider integer number N are modulated in response to a binary signal. As the frequency of VCO 108 is varied, the divider integer number of frequency synthesizer 104 is likewise varied from N to N+1 or N−1, depending on the state of the binary signal. Thus, the change in frequency of VCO 108 is offset by the change in the divider integer number so that there is essentially no change in the magnitude of the error signal from frequency synthesizer 104. For example, as the frequency of the VCO output signal is increased, the divider integer number N is likewise increased so that the error signal from frequency synthesizer 104 remains constant. A further advantage of the present invention provided by modulating both the divider integer number N and VCO 108 in response to the binary signal is that amplitude distortion of the modulated signal is substantially eliminated.

A data/voice select signal selects between binary signals and voice or tone signals. The data/voice select signal is applied to an address input of ROM 120 for addressing a portion ROM 120 containing a number for changing the divider integer number N to N−1 for the binary zero state and to N+1 for the binary one state of the binary signal. The data/voice select signal is also applied to transmission gate 130 for applying the binary signal by way of resistor 134 to a voltage divider formed by resistors 122 and 123.

Voltage divider resistors 122 and 123 apply approximately one-half of the +V voltage supply to summing applifier 128 by way of resistor 124. When transmission gate 130 is off, summing amplifier 128 is biased at one-half of the +V voltage supply, which voltage level is correspondingly applied to VCO 108. The gain of summing amplifier is set by the resistance of feedback resistor 136 and input resistors 124 and 127. When transmission gate 130 is enabled by the data/voice select signal, either a zero voltage level or a +V voltage level is applied by way of resistor 134 to voltage divider resistors 122 and 123 depending on whether the binary signal has a binary zero state or a binary one state, respectively. The resistance of resistor 134 can be varied to vary the voltage levels applied to resistor 124, which correspondingly determines the amount of frequency deviation of VCO 108. Thus, the voltage levels applied via resistor 124 to summing amplifier 128 by the binary signal correspondingly deviate the frequency of VCO 108. When transmission gate 130 is disabled, the voice signal, an analog signal consisting of voice or tone signals, may deviate the frequency of VCO 108.

The voice signal is amplified and filtered by audio amplifier and filter 132 and AC coupled by capacitor 126 and resistor 127 to summing amplifier 128. The magnitude of the voice signal can be varied by varying the gain of audio amplifier 132, which correspondingly determines the amount of frequency deviation of VCO 108. Audio amplifier and filter 132 may also contain circuitry for limiting the frequency deviation of VCO 108, such as that described in U.S. Pat. No. 3,626,331 (incorporated herein by reference thereto) and the instant assignee's co-pending U.S. patent application Ser. No. 267,096 (incorporated herein by reference thereto), entitled "Radio Transmitter Modulation Control Circuitry" and filed on May 26, 1981. Since transmission gate 130 is disabled when binary signals are absent, summing amplifier 128 is biased at one-half on the +V voltage supply. The AC coupled voice signal applies a symmetrically varying voltage to the biased summing amplifier 128, which correspondingly causes the frequency of VCO 108 to be deviated symmetrically. Since the voice signal is AC coupled to summing amplifier 128, a DC offset is not introduced and the frequency of VCO 108 is symmetrically deviated.

By utilizing the frequency modulator of the present invention, the frequency of the VCO 108 is symmetrically deviated by both binary signals and voice signals. In prior art frequency modulators, it was possible to develop an offset of VCO frequency whenever the number of binary zero bits exceeded the number of binary one bits, and vice versa. Whenever such a condition occurred, the magnitude of the error signal from frequency synthesizer 104 would not remain constant, either increasing or decreasing. However, the inventive modulator of the present invention maintains the magnitude of the error signal constant by modulating both VCO 108 and the divider integer number in response to the binary signal. The error signal remains essentially constant since the voltage change applied to VCO 108 is substantially offset by the change of the divider integer number.

Transmitter 100 in FIG. 1 can provide a directly modulated FM signal having a frequency range dependent on the operating characteristics of circuitry selected for the various blocks. If a Motorola type MC145146 frequency synthesizer 104 and Motorola type MC12011 and MC10178 dividers 114 and 116 are utilized, the FM signal can have frequencies up to 546 MHz. In order to provide a frequency range from 450 to 500 MHz and a frequency deviation of plus and minus 4,166 Hz for binary signals, reference oscillator 102 may be selected to have a frequency of 17.066 MHz so that with a reference divider number of 4096, a 4,166 Hz signal will be provided by reference divider 404. The divider integer number provided by dividers 114, 116 and 402 can vary from zero to 131,200, providing radio channels spaced at 25 KHz from one another. For a 25 KHz channel spacing, the divider integer number N need only change by 6 in order to change from one radio channel to an adjacent radio channel. In order deviate the frequency of VCO 108 by plus and minus 4,166 Hz, ROM 120 would be loaded with divider integer numbers of N−1 for a binary zero state and N+1 for a binary one state. For an operating frequency of 450 MHz, the divider integer N would be 108,000 and would be changed between N−1 or 107,999 and N+1 or 108,001 in response to a binary signal.

Referring to FIG. 2, there is illustrated another embodiment of the frequency modulator of the present invention. All blocks in FIG. 2 that are substantially identical to blocks in FIG. 1 have been identified by the same reference number. The functional operation of the frequency modulator in FIG. 2 is substantially identical to the functional operation described hereinabove for the frequency modulator in FIG. 1. The frequency synthesizer 104 may be a Motorola type MC145152 frequency synthesizer (incorporated herein by reference thereto), which accepts sixteen inputs in parallel for loading loop divider 402 and reference divider 404 therein. The exact interconnections between frequency synthesizer 104 and blocks 102, 106, 116, 202 and 204 can be readily determined from the published specifications for the Motorola type MC145152 frequency synthesizer. The frequency modulator in FIG. 2 differs from that in FIG. 1 in that latches 202 and 204 have been added. Latches 202 and 204 are synchronously loaded in response to the error signal from the frequency synthesizer 104. Use of latches 202 and 204 insures that changes to the divider integer number and voltage changes applied to the voltage divider resistors 122 and 123 are synchronously applied.

According to another feature of the present invention, the synchronous application of changes in the divider integer number and voltage changes applied to VCO 108 insures that the transmitted binary signal has a minimum of amplitude distortion near bit edges of the binary signal where the binary state is changing. This feature of the present invention can be more clearly understood with reference to waveforms illustrated in FIG. 3. Error signal 220 from frequency synthesizer 104 is applied to the clock input of both latches 202 and 204. New divider integer numbers read out of ROM 120 are latched into latch 202 in response to error signal 220.

Figure 3:
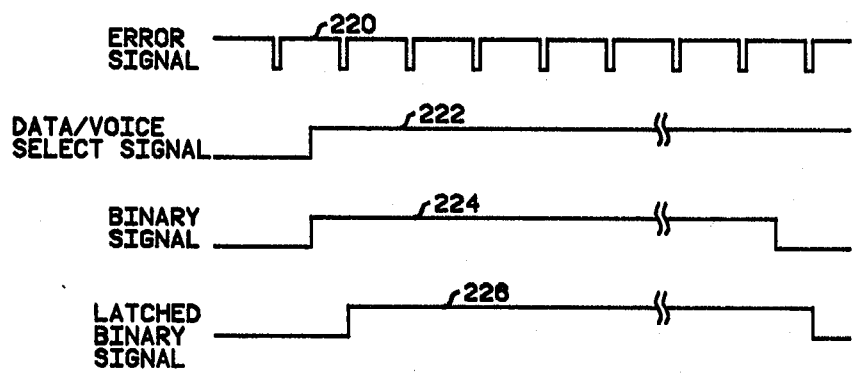
FIG. 3 illustrates the waveforms of selected signals for the frequency modulator in FIG. 2.

Similarly, the binary signal 224 and the data/voice select signal 222 are loaded into latch 204 in response to error signal 220. Thus, if the binary signal 224 or the data/voice select signal 222 change in the interval between successive pulses of error signal 220, a new divider integer number and a voltage change will only be applied to frequency synthesizer 104 and VCO 108, respectively, in synchronism with the pulses of error signal 220. For example, waveform 226 of the latched binary signal coupled from latch 204 to transmission gates 130 and 206 changes state in synchronism with the pulse of error signal 220, as illustrated in FIG. 3. This feature of the present invention avoids amplitude distortion of the binary signal near the bit edges which would be produced by the application of voltages changes to VCO 108 before the divider number is changed in frequency synthesizer 104, but introduces some phase distortion since bit transitions may be slightly skewed with respect to one another.

According to yet another feature of the present invention, modulation of VCO 108 by the voice signal may be blocked whenever binary signals are present. This feature of the present invention can be provided by means of transmission gate 206, which blocks the voice signal from audio amplifier and filter 132 when the latched data/voice select signal from latch 204 has a binary one state, indicating that the binary signal 224 is present. Blocking the voice signal insures that noise or extraneous signals thereon do not interfere with modulation of the VCO output signal by the binary signal 224.

In summary, an improved RF signal transmitter has been described which can be symmetrically modulated by either binary signals or voice signals. The inventive RF signal transmitter includes a phase-locked loop that can be based on a high stability internal reference signal or an externally generated reference signal. The inventive RF signal transmitter can be advantageously utilized in any application requiring high frequency stability, such as, for example, the base station radio transmitters utilized in the radio system described in U.S. Pat. No. 3,906,106 (incorporated herein by reference thereto) and in the simulcast system described in U.S. Pat. No. 4,188,582 (incorporated herein by reference thereto).

I claim:

1. Circuitry for frequency modulating an output signal in accordance with a binary signal from a first signal source, the first signal source further providing a data select signal when the binary signal is present, said frequency modulating circuitry comprising:
   means for generating a reference signal;
   means for comparing the phase of the reference signal to the phase of a feedback signal to provide an error signal;
   means for filtering the error signal to provide a filtered error signal;
   summing amplifier means having an input and an output;
   voltage biasing means coupled to the input of the summing amplifier means for applying a predetermined voltage thereto;
   means for coupling an analog signal from a second signal source to the input of the summing amplifier means;
   switching means responsive to the data select signal for applying the binary signal to the voltage biasing means;

voltage-controlled oscillator (VCO) means having a first input coupled to the filtered error signal for generating an output signal and having a second input coupled to the output of the summing amplifier means for frequency modulating the VCO output signal;

means for dividing the VCO output signal by a predetermined number to provide the feedback signal; and means coupled to the dividing means for varying the predetermined number of the dividing means between a first predetermined number and second predetermined number in response to the binary signal.

2. The frequency modulating circuitry according to claim 1, further including second switching means interposed between the analog signal and the input of the summing amplifier means, the second switching means being responsive to the data select signal for opening the path between the analog signal and the summing amplifier means.

3. The frequency modulating circuitry according to claim 1 or 2, further including antenna means and amplifying means, the amplifying means coupled to the VCO means and antenna means for amplifying the VCO output signal for transmission by the antenna means.

4. Circuitry for frequency modulating an output signal in accordance with a binary signal from a signal source, the signal source further providing a data select signal when the binary signal is present and a plurality of frequency select signals for selecting the frequency of the output signal, said frequency modulation circuitry comprising:

means for generating a reference signal;

means for comparing the phase of the reference signal to the phase of a feedback signal to provide an error signal;

means for filtering the error signal to provide a filtered error signal;

voltage-controlled oscillator (VCO) means having a first input coupled to the filtered error signal for generating an output signal having a frequency dependent on the magnitude of the filtered error signal and having a second input coupled to the binary signal for frequency modulating the VCO output signal with the binary signal;

memory means for storing different predetermined numbers, the memory means being responsive to the frequency select signals, the data select signal and the binary signal for reading out the stored predetermined number addressed thereby; and means for dividing the VCO output signal by the read-out predetermined number from the memory means to provide the feedback signal.

5. The frequency modulating circuitry according to claim 4, further including summing amplifier means having an input and an output, voltage biasing means coupled to the input of the summing amplifier means for applying a predetermined voltage thereto, means for coupling an analog signal from a second signal source to the input of the summing amplifier means, and switching means responsive to the data select signal for applying the binary signal to the voltage biasing means, the output of the summing amplifier means being coupled to the VCO means for varying the frequency of the VCO output signal in response to the signals applied to the input of the summing amplifier means.

6. The frequency modulating circuitry according to claim 5, further including second switching means interposed between the analog signal and the input of the summing amplifier means, the second switching means being responsive to the data select signal for opening the path between the analog signal and the summing amplifier means.

7. The frequency modulating circuitry according to claim 6, further including first storing means interposed between the memory means and the dividing means for storing in response to the error signal the read-out predetermined number, second storing means interposed between the binary signal and the first switching means for storing in response to the error signal the binary signal, and third storing means interposed between the data select signal and the first switching means for storing in response to the error signal the data select signal.

8. The frequency modulating circuitry according to claim 5, further including first storing means interposed between the memory means and the dividing means for storing in response to the error signal the read-out predetermined number, and second storing means interposed between the binary signal and the first switching means for storing in response to the error signal the binary signal.

9. The frequency modulating circuitry according to claim 8, further including third storing means interposed between the data select signal and the first switching means for storing in response to the error signal the data select signal.

10. The frequency modulating circuitry according to claim 4, 6, 7 or 9, further including antenna means and amplifying means, the amplifying means being coupled to the VCO means and antenna means for amplifying the VCO output signal for transmission by the antenna means.

* * * * *